United States Patent
Koizumi et al.

(10) Patent No.: US 7,441,317 B2
(45) Date of Patent: Oct. 28, 2008

(54) PIEZOELECTRIC/ELECTROSTRICTIVE DEVICE AND METHOD FOR MANUFACTURING THE SAME

(75) Inventors: Takaaki Koizumi, Nagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/273,828

(22) Filed: Nov. 15, 2005

(65) Prior Publication Data
US 2006/0119229 A1  Jun. 8, 2006

(30) Foreign Application Priority Data
Dec. 2, 2004  (JP)  .............................. 2004-349378

(51) Int. Cl.
  *H01L 41/22* (2006.01)
  *H01L 41/187* (2006.01)
(52) U.S. Cl. ...................... 29/25.35; 310/358
(58) Field of Classification Search ................. 310/320; 29/25.35, 846, 851; 427/100
See application file for complete search history.

(56) References Cited

U.S. PATENT DOCUMENTS

| | | | |
|---|---|---|---|
| 4,639,280 A * | 1/1987 | Fredholm et al. | 148/404 |
| 5,126,615 A * | 6/1992 | Takeuchi et al. | 310/330 |
| 6,337,805 B1 * | 1/2002 | Forbes et al. | 365/145 |
| 6,343,855 B1 * | 2/2002 | Sakamaki et al. | 347/68 |
| 2003/0125193 A1 * | 7/2003 | Kobayashi et al. | 501/139 |
| 2003/0134738 A1 * | 7/2003 | Furukawa et al. | 501/135 |
| 2003/0234595 A1 * | 12/2003 | Takahashi et al. | 310/324 |

FOREIGN PATENT DOCUMENTS

JP 2001-284677 A1 10/2001

OTHER PUBLICATIONS

D. McLean, The physics of high temperature creep in metals, 1966.*
* cited by examiner

*Primary Examiner*—Darren Schuberg
*Assistant Examiner*—Derek J Rosenau
(74) *Attorney, Agent, or Firm*—Burr & Brown

(57) ABSTRACT

A piezoelectric/electrostrictive device is provided, including a substrate, an electrode layer adhering to the surface of the substrate, and a piezoelectric/electrostrictive layer adhering to the electrode layer. The electrode layer is deformed by high-temperature creep. A method for manufacturing the piezoelectric/electrostrictive device is provided including a step of cooling the piezoelectric/electrostrictive device, after firing, at a temperature decreasing rate of at least the rate of natural cooling. The cooling step includes a sub-step of holding the piezoelectric/electrostrictive device at a constant holding temperature that is lower than the firing temperature. The holding temperature is within a range of temperatures at which high-temperature creep occurs in the metal of the electrode layer so that residual stress in the piezoelectric/electrostrictive layer can be reduced.

4 Claims, 4 Drawing Sheets

PIEZOELECTRIC/ELECTROSTRICTIVE DEVICE AND METHOD FOR MANUFACTURING THE SAME

BACKGROUND OF THE INVENTION

1. Field of the Invention

The present invention relates to a piezoelectric/electrostrictive device including an electrode layer adhering to the upper surface of a substrate and a piezoelectric/electrostrictive layer adhering to the upper surface of the electrode layer, and to a method for manufacturing the same.

2. Description of the Related Art

A piezoelectric/electrostrictive device having such a structure has been disclosed in, for example, Japanese Unexamined Patent Application Publication No. 2001-284677. The piezoelectric/electrostrictive device has a metal-based electrode layer in tight contact with the surface of a ceramic substrate mainly containing zirconia, and piezoelectric/electrostrictive layer in tight contact with the electrode layer. The piezoelectric/electrostrictive device having such a structure is generally manufactured by the following process.

First, an electrode layer or an electrode precursor coating (turned to an electrode layer by heat treatment) is applied onto the surface of a substrate (first layer forming step, the electrode layer or the electrode precursor coating hereinafter referred to as the first layer). Then, a second layer containing a piezoelectric/electrostrictive material is formed on the first layer (second layer forming step). Subsequently, the multilayer composite prepared by the steps up to the second layer forming step is heated to a firing temperature to fire at least the second layer (firing step). If the first layer is the electrode layer, the firing step fires only the second layer; if the first layer is the electrode precursor coating, the firing step fires both the first layer and the second layer. After the firing step, the multilayer composite is cooled at a temperature decreasing rate of at least the rate of natural cooling (cooling step).

In order for the piezoelectric/electrostrictive device to exhibit a variety of advantageous characteristics, including not only piezoelectric/electrostrictive characteristics, but also environmental characteristics, such as possibility of using no harmful chemicals, various materials can be used for the piezoelectric/electrostrictive layer and the substrate.

However, the thermal expansion coefficient of the piezoelectric/electrostrictive layer may be larger than that of the substrate, depending on the combination of their materials. In such a condition, the piezoelectric/electrostrictive layer tends to shrink more than the substrate in the cooling step, while the substrate suppresses the shrinkage of the piezoelectric/electrostrictive layer because of the small shrinkage of the substrate. Consequently, tensile stress is produced in the piezoelectric/electrostrictive layer.

A large difference between the thermal expansion coefficient of the piezoelectric/electrostrictive layer and the substrate produces a large residual tensile stress in the piezoelectric/electrostrictive layer in the known process, and accordingly the piezoelectric/electrostrictive characteristics are degraded. In addition, the piezoelectric/electrostrictive layer may be cracked during the cooling step or a subsequent polarization step.

SUMMARY OF THE INVENTION

In view of the above-described circumstances, the present invention provides a piezoelectric/electrostrictive device exhibiting superior piezoelectric/electrostrictive characteristics and a method for manufacturing the same.

According to one aspect of the present invention, a piezoelectric/electrostrictive device is provided, including a substrate, an electrode layer adhering to the surface of the substrate, and a piezoelectric/electrostrictive layer adhering to the surface of the electrode layer. The electrode layer is deformed by high-temperature creep.

According to another aspect of the present invention, a method for manufacturing the piezoelectric/electrostrictive device is provided. The method includes a first layer forming step of forming a first layer containing a metal on a substrate so as to form an electrode layer onto the surface of the substrate; a second layer forming step of forming a second layer containing a piezoelectric/electrostrictive material on the first layer; a firing step of heating the substrate having the first layer and the second layer to a firing temperature to fire at least the second layer, thereby producing the piezoelectric/electrostrictive device; and a cooling step of cooling the piezoelectric/electrostrictive device after the firing step. Preferably, the cooling step cools the piezoelectric/electrostrictive device after the firing step at a temperature decreasing rate of at least the rate of natural cooling.

Specifically, according to the present invention, the cooling step includes the sub-step of holding the piezoelectric/electrostrictive device at a constant temperature lower than the firing temperature during the cooling step. Namely, according to the present invention, the piezoelectric/electrostrictive device is cooled from the firing temperature to a predetermined holding temperature (at a temperature decreasing rate of at least the natural cooling rate), and is subsequently allowed to stand at the holding temperature for a predetermined time. Then, the piezoelectric/electrostrictive device is cooled again (at a temperature decreasing rate of at least the natural cooling rate).

By cooling the piezoelectric/electrostrictive device after the firing step (at a temperature decreasing rate of at least the natural cooling rate), the grain size of the piezoelectric/electrostrictive layer is controlled to exhibit the desired piezoelectric/electrostrictive characteristics. Specifically, the excessive growth of the crystal grains in the piezoelectric/electrostrictive layer, which is caused by simple natural cooling, can be prevented. By holding the piezoelectric/electrostrictive device at a predetermined holding temperature, high-temperature creep occurs in the metal-based electrode layer by the residual stress produced in the piezoelectric/electrostrictive layer during cooling by the difference between the thermal expansion coefficient of the substrate and the piezoelectric/electrostrictive layer. Hereby, the residual stress is reduced by the high-temperature creep.

In the method, when the first layer forming step directly forms a metal electrode layer on the substrate by, for example, vapor deposition or plating, the first layer refers to the electrode layer. Alternatively, when the first layer forming step forms, for example, a metal paste coating that is turned into the electrode layer through a subsequent step (for example, heat treatment), the first layer refers to an electrode precursor layer before the subsequent step (for example, metal paste coating). In this case, the electrode layer may be formed by firing the first layer together with the second layer in the firing step, or by firing the first layer singly in an electrode layer firing step preceding the second layer forming step.

The temperature holding sub-step may be performed a plurality of cycles. For example, after the piezoelectric/electrostrictive device is cooled from the firing temperature to a first holding temperature at the temperature decreasing rate of at least the natural cooling rate in the cooling step, the first holding temperature is maintained for a predetermine time. Then, the first holding temperature is reduced to a second holding temperature at a temperature decreasing rate of at least the natural cooling rate, and the second holding temperature is maintained for a predetermined time. Subsequently, the second holding temperature is reduced at a temperature decreasing rate of at least the natural cooling rate.

Preferably, the constant temperature is within the range of temperatures at which high-temperature creep occurs in the metal of the electrode layer. Specifically, the constant temperature can be at least 0.3 times as high as the melting point in Kelvin of the metal. More preferably, the constant temperature is 0.5 times as high as the melting point in Kelvin of the metal.

According to the present invention, the residual stress in the piezoelectric/electrostrictive layer can be reduced by high-temperature creep. Consequently, degradation of the characteristics of the piezoelectric/electrostrictive layer resulting from the residual stress can be prevented, and the resulting piezoelectric/electrostrictive device can exhibit superior piezoelectric/electrostrictive characteristics.

DETAILED DESCRIPTION OF THE INVENTION

A preferred embodiment of the present invention will now be described with reference to the drawings.

Structure of Piezoelectric/Electrostrictive Device

Figure 1:
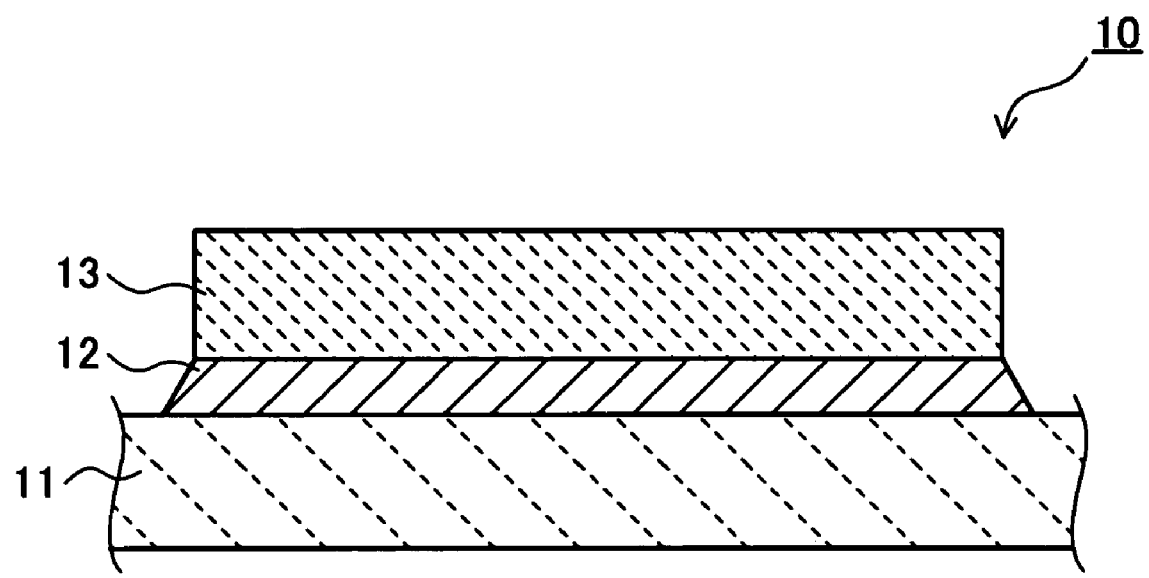
FIG. 1 is a schematic sectional side view of a piezoelectric/electrostrictive device according to an embodiment of the present invention.

FIG. 1 is a schematic sectional side view of a piezoelectric/electrostrictive device 10 according to an embodiment of the present invention. The piezoelectric/electrostrictive device 10 includes a substrate 11, an intermediate electrode layer 12 formed on the surface of the substrate 11, and a piezoelectric/electrostrictive layer 13 formed on the surface of the intermediate electrode layer 12.

The substrate 11 is a ceramic thin plate. Preferably, the substrate 11 is made of zirconium oxide, aluminium oxide, magnesium oxide, aluminium nitride, or silicon nitride. Most preferably, zirconium oxide-based materials are used. In particular, materials mainly containing fully stabilized zirconium oxide or partially stabilized zirconium oxide can lead to a high mechanical strength and toughness even if they are formed into a thin film, and are less reactive with the constituents of the intermediate electrode layer 12 and the piezoelectric/electrostrictive layer 13.

The intermediate electrode layer 12 is formed so as to adhere to the surface of the substrate 11. The word "adhere" used herein means to be directly and tightly in contact with the substrate without use of any adhesive. The intermediate electrode layer 12 essentially composed of a metal. Examples of the metal include platinum, gold, silver, iridium, palladium, rhodium, molybdenum, tungsten, and their alloys. The intermediate electrode layer 12 may contain an additive (for example, low-melting-point glass) for enhancing the adhesion to the substrate 11 or the piezoelectric/electrostrictive layer 13, depending on the combination of the constituents of these layers and the metal.

The intermediate electrode layer 12 preferably has a thickness of about 0.1 to 20 μm, and more preferably about 1 to 5 μm.

The piezoelectric/electrostrictive layer 13 is formed so as to adhere to the upper surface of the intermediate electrode layer 12. The piezoelectric/electrostrictive layer 13 is made of a piezoelectric/electrostrictive material (piezoelectric ceramic). Preferred piezoelectric/electrostrictive materials mainly contain perovskite ferroelectrics, tungsten bronze ferroelectrics, or bismuth layered ferroelectrics.

Examples of these ferroelectrics include: lead-based materials, such as lead titanate, lead zirconate, lead titanate zirconate (PZT), lead magnesium niobate (PMN), lead nickel niobate (PNN), lead manganese niobate, lead antimony stannate, and lead zinc niobate; and non-lead materials, such as barium titanate, bismuth sodium titanate, strontium sodium niobate, barium sodium niobate, potassium niobate, bismuth nickel titanate, $Ba_2NaNb_5O_{15}$, $Bi_4Ti_3O_{12}$ (BIT), $BaNd_2Ti_4O_{12}$ (BNT), and $(Bi_{0.5}Na_{0.5})TiO_3$. Complex materials or solid solutions of these materials may be suitably used, such as PMN-PZ-PT ternary solid solutions, $(Bi_{0.5}Na_{0.5})TiO_3$—$BaTiO_3$ (BNT-BT) solid solutions, $(Bi_{0.5}Na_{0.5})TiO_3$—$BaTiO_3$—$SrTiO_3$ (BNT-BT-ST) solid solution, and $(1-x)(Bi_{0.5}Na_{0.5})TiO_3$-$xKNbO_3$ (where x is molar fraction satisfying $0 \leq x \leq 0.06$).

The piezoelectric/electrostrictive material of the piezoelectric/electrostrictive layer can contain an oxide or any other compound of lanthanum, barium, niobium, zinc, cerium, cadmium, chromium, cobalt, strontium, antimony, iron, yttrium, tantalum, tungsten, nickel, manganese, or the like, if necessary.

Raw materials of the piezoelectric/electrostrictive material include: oxides of Ba, Bi, Na, Ti, K, and Nb, such as BaO, $Na_2O$, $TiO_2$, $K_2O$, and $Nb_2O_5$, for example, compounds of these elements that can be turned into oxides by firing, such as of hydroxides, carbonates, oxalates, and nitrates; compounds containing at least two of these elements, such as $MgNb_2O$; and elemental metals or alloys of these elements. These raw materials may be used singly or in combination. The piezoelectric/electrostrictive layer 13 can be formed by a generally used manufacturing technique, such as screen printing, dipping, coating, or a green sheet method.

In the piezoelectric/electrostrictive device 10 having the above-described structure, at least the intermediate electrode layer 12 is connected to a predetermined power source and a predetermined driving voltage is applied to both ends of the piezoelectric/electrostrictive layer 13. Consequently, an electric field-induced deformation is generated in the piezoelectric/electrostrictive layer 13. The electric field-induced deformation causes the substrate 11 to act in a predetermined manner, for example, to vibrate. In order to produce a larger electric field-induced deformation with a lower driving voltage, the thickness of the piezoelectric/electrostrictive layer 13 is preferably about 3 to 50 μm, and more preferably 40 μm or less.

The piezoelectric/electrostrictive layer 13 in the present embodiment is made of a piezoelectric/electrostrictive material having a larger linear expansion coefficient than the substrate 11. The intermediate electrode layer 12 is disposed between the substrate 11 and the piezoelectric/electrostrictive layer 13 that have different linear expansion coefficients and is deformed in the shear direction by high-temperature creep. Consequently, the tensile stress remaining in the piezoelectric/electrostrictive layer 13 is reduced. This mechanism will be described in detail later. Whether the intermediate electrode layer 12 has been deformed by the high-temperature creep can be known by observing void deformation or sub-boundaries with a scanning electron microscope (SEM), or dislocation or sub-boundaries with a transmission electron microscope (TEM).

Method for Manufacturing the Piezoelectric/Electrostrictive Device

A method for manufacturing the piezoelectric/electrostrictive device 10 will now be described with reference to FIGS. 2A to 2D and 3.

Figure 2A:
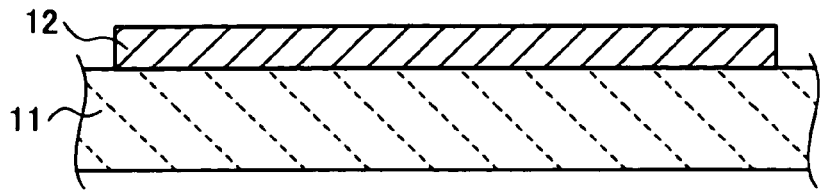
FIGS. 2A to 2D are schematic sectional views illustrating a method for manufacturing the piezoelectric/electrostrictive device shown in FIG. 1.

First, the intermediate electrode layer 12 is formed on the substrate 11, as shown in FIG. 2A (intermediate electrode layer forming step). The formation of the intermediate electrode layer 12 is performed by, for example, ion beam irradiation, sputtering, vacuum vapor deposition, physical vapor deposition (PVD), ion plating, chemical vapor deposition (CVD), plating, screen printing, spray coating, or dipping. Among these, sputtering and screen printing are preferred from the viewpoint of the adhesion to the substrate 11 and the piezoelectric/electrostrictive layer 13.

The resulting intermediate electrode layer 12 may be subjected to heat treatment at a temperature of about 500 to 1,400° C., thereby adhering to the substrate 11 to integrate with it. The heat treatment may be performed before forming an unfired piezoelectric/electrostrictive layer 13', or simultaneously with below-descried heat treatment for firing the piezoelectric/electrostrictive layer 13. If the piezoelectric/electrostrictive material is fired at a low temperature of 1,000° C. or less, the intermediate electrode layer 12 is preferably a low-melting-point metal electrode, such as that of Ag or Au, from the viewpoint of the piezoelectric/electrostrictive characteristics.

Figure 2B:
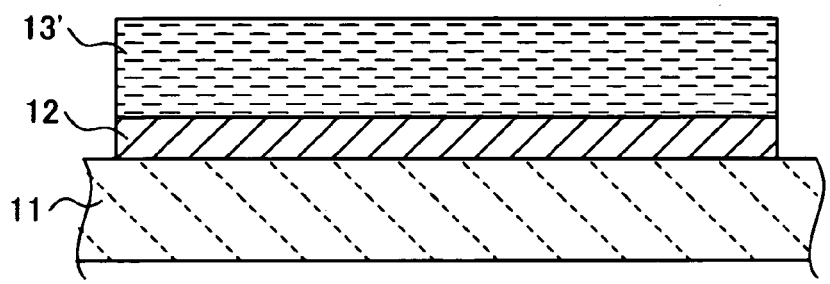

Turning to FIG. 2B, an unfired piezoelectric/electrostrictive layer 13' containing the piezoelectric/electrostrictive material is formed on the intermediate electrode layer 12 (unfired piezoelectric/electrostrictive layer forming step). The formation of the unfired piezoelectric/electrostrictive layer 13' is performed by a generally used technique, such as screen printing, dipping, coating, electrophoresis, aerosol deposition, ion beam irradiation, sputtering, vacuum vapor deposition, ion plating, CVD, plating, or green sheeting.

Figure 2C:
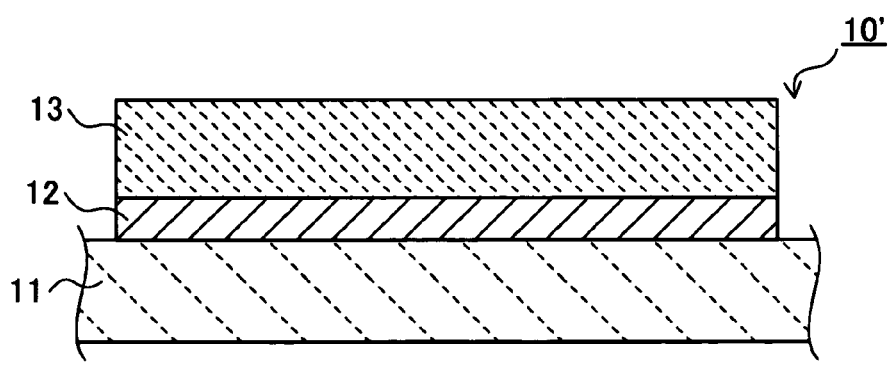

The resulting unfired piezoelectric/electrostrictive layer 13' is fired at a temperature of 1,100 to 1,300° C. to complete the piezoelectric/electrostrictive layer 13, as shown in FIG. 2C (firing step). The firing step performed herein refers to not only firing applied to wet processes, such as green sheeting, but also heat treatment for increasing the density of the texture, applied to dry processes, such as aerosol deposition.

Figure 3:
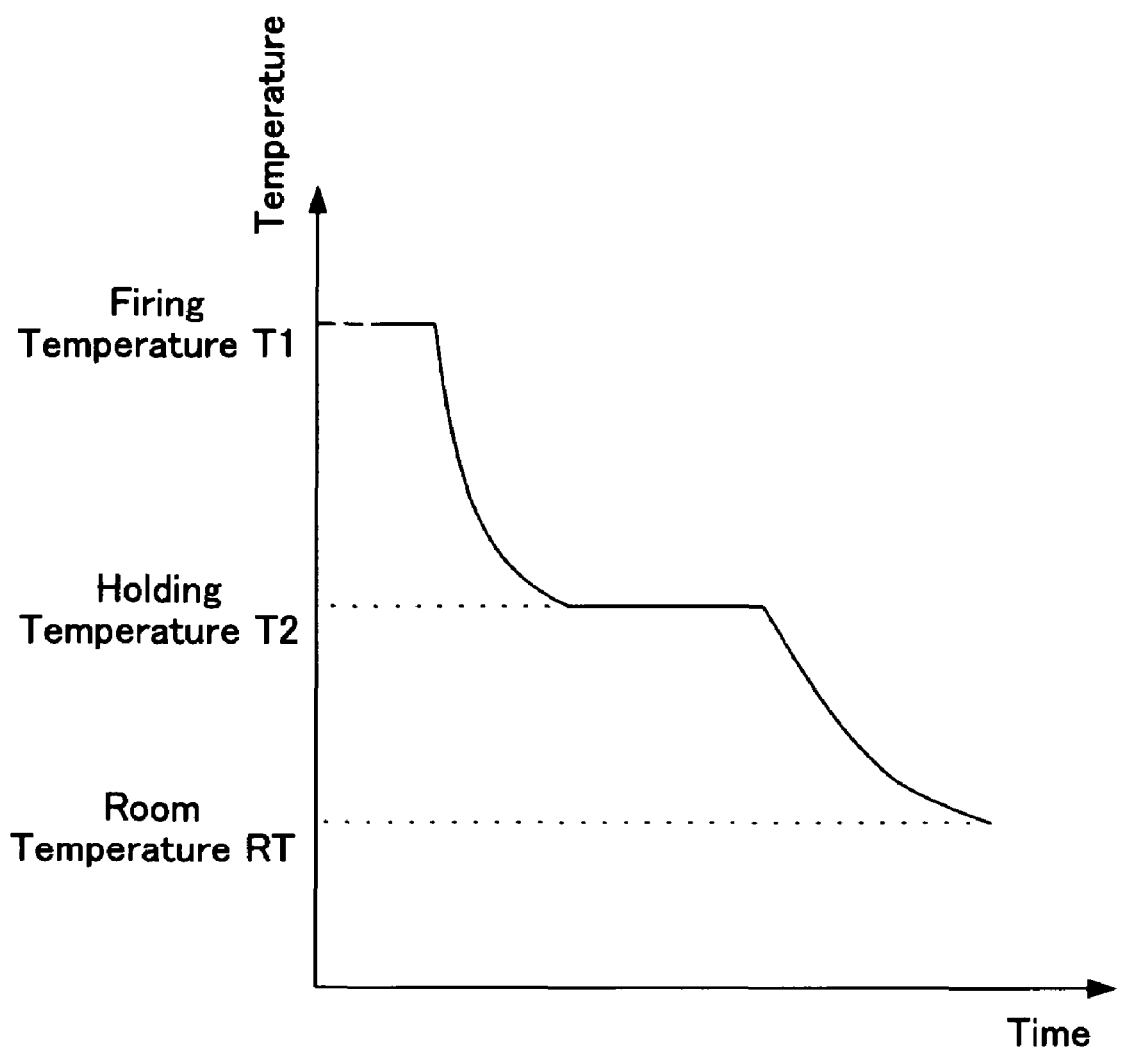
FIG. 3 is a profile of the temperature used in a cooling step in the method shown in FIGS. 2A to 2D.

Finally, the resulting layered composite 10' (piezoelectric/electrostrictive device before cooling) having the completed piezoelectric/electrostrictive layer 13 obtained by the firing step is cooled through the temperature profile shown in FIG. 3 (cooling step).

The layered composite 10' is rapidly cooled at a temperature decreasing rate of about 200° C./hour, faster than the rate of natural cooling, from the firing temperature T1 to a below-described holding temperature T2. Consequently, the crystal grains of the piezoelectric/electrostrictive layer 13 become fine; hence, the crystal grains are prevented from growing so excessively that the piezoelectric/electrostrictive effect of the piezoelectric/electrostrictive layer 13 is degraded.

The piezoelectric/electrostrictive layer 13 tends to shrink more during the cooling step than the substrate 11, which has a lower linear expansion coefficient than the piezoelectric/electrostrictive layer 13. However, since the lower surface of the piezoelectric/electrostrictive layer 13 opposing the substrate 11 is combined to the substrate 11 with the intermediate electrode layer 12 therebetween, the shrinkage of the lower surface is suppressed by the less shrinking substrate 11. Consequently, a tensile stress is produced in the piezoelectric/electrostrictive layer 13.

Figure 2D:
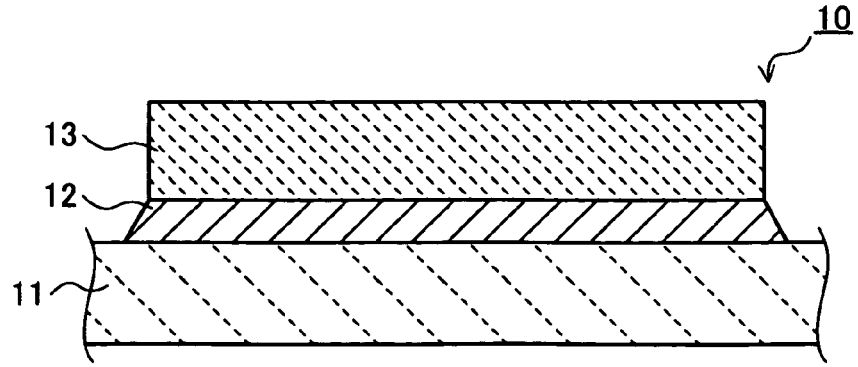

Then, the layered composite 10' having the intermediate electrode layer 12 that has been cooled to the holding temperature T2 capable of causing high-temperature creep is allowed to stand at the holding temperature T2 for about 5 hours (sub-step of temperature holding). Consequently, the tensile stress in the piezoelectric/electrostrictive layer 13 causes high-temperature creep and thus plastic-deforms the intermediate electrode layer 12, as shown in FIG. 2D, and the reaction reduces the residual stress in the piezoelectric/electrostrictive layer 13.

Since metals can produce high-temperature creep at temperatures of at least 0.3 times as high as the melting point ($T_m$), the holding temperature T2 can be $0.3T_m$ or more, and preferably $0.5T_m$ or more.

It may be preferable that the intermediate electrode layer 12 has a large thickness, from the viewpoint of reducing the residual stress in the piezoelectric/electrostrictive layer 13 by the high-temperature creep. However, it may be preferable that the intermediate electrode layer 12 has a smaller thickness, from the viewpoint of achieving a highly efficient piezoelectric/electrostrictive device 10 having a piezoelectric/electrostrictive layer 13 that can efficiently transmit vibration and displacement produced by the piezoelectric/electrostrictive effect to the substrate 11. Accordingly, the thickness of the intermediate electrode layer 12 is preferably about 0.1 to 20 µm, and more preferably about 1 to 5 µm.

After being held at the holding temperature T2 for a predetermined time, the layered composite 10' is cooled to room temperature RT at a rate of at least the natural cooling rate, thus completing the piezoelectric/electrostrictive device 10.

The temperature holding step may be repeated at a holding temperature T2' in the course of cooling to room temperature RT from the holding temperature T2. How many times the temperature holding sub-step is performed in the cooling step is determined from the following equation:

$$s=(T_b-0.3T_m)/DT$$

where $T_b$ is firing temperature (K); DT is critical temperature change (K) derived from the tensile strength of the material of the piezoelectric/electrostrictive layer 13; and $T_m$ is melting point (K) of the metal being the main constituent of the intermediate electrode layer 12.

The critical temperature change DT is approximated as follows:

$$DT \approx k\sigma/\{E(\alpha p-\alpha b)\}+\beta$$

where k and β are constants, σ is the tensile strength of the piezoelectric/electrostrictive material, E is the Young's modulus of the piezoelectric/electrostrictive material, αp is the linear expansion coefficient of the piezoelectric/electrostrictive material, and αb is the linear expansion coefficient of the material of the substrate 11. β is much lower than $k\sigma/\{E(\alpha p-\alpha b)\}$.

The number of cycles of the temperature holding sub-step is defined by a natural number N satisfying the relationship $(N-1)<s \leq N$. For example, when the S value is 1 or less, the temperature holding sub-step can be performed only once, and when $1<s \leq 2$, the temperature holding sub-step is performed twice.

In particular, when the piezoelectric/electrostrictive material has a melting point of $T_{mp}$ K and the relationship $0.7T_{mp} \leq T_b$ holds, the temperature holding sub-step is preferably performed plural times (often twice) so as to prevent the decrease in strength of the piezoelectric/electrostrictive layer 13 resulting from the growth of the crystal grains of the piezoelectric/electrostrictive material or the vaporization of low-melting point constituents, and to prevent the variation of the composition of the piezoelectric/electrostrictive layer 13.

As described above, the method of the present embodiment can reduce the residual tensile stress in the piezoelectric/electrostrictive layer 13, and thus enhances piezoelectric/electrostrictive characteristics of the piezoelectric/electrostrictive layer 13. In addition, the method of the present embodiment allows the use of piezoelectric/electrostrictive materials that may cause cracks and accordingly cannot be used in the known method, so that the piezoelectric/electrostrictive device can exhibit satisfactory characteristics.

Specific Method

The embodiment of the method for manufacturing the piezoelectric/electrostrictive device 10 having the above-described structure will now be more specifically described. For example, the substrate 11 is made of $ZrO_2$ (linear expansion coefficient: $10 \times 10^{-6}$ to $11 \times 10^{-6}$ $K^{-1}$) stabilized by $Y_2O_3$, and the intermediate electrode layer 12 is made of platinum (melting point $T_m(Pt)=2,042$ K ($1,769°$ C.)). The piezoelectric/electrostrictive layer 13 is made of a solid solution of bismuth sodium titanate and potassium niobate (hereinafter referred to as BNT-KN, linear expansion coefficient: $13 \times 10^{-6}$ $K^{-1}$).

Turning now to the intermediate electrode layer forming step, a platinum resinate paste coating is applied in a predetermined shape with predetermined dimensions on the substrate 11 by screen printing, followed by drying. Then, the platinum resinate paste coating is heat-treated at about $1,400°$ C., thereby forming the intermediate electrode layer 12. The intermediate electrode layer 12 thus adheres to the surface of the substrate 11 to integrate with the substrate 11.

In the unfired piezoelectric/electrostrictive layer forming step, a slurry prepared by dispersing BNT-KN powder in a binder is applied at a thickness of about 40 μm in a predetermined shape with a predetermined dimensions onto the intermediate electrode layer 12 by screen printing, thus forming the piezoelectric/electrostrictive material coating 13'.

In the firing step, the binder is removed by heating at about $500°$ C., and subsequently the resulting layered composite is heated at $1,100°$ C. for 3 hours, thus completing the piezoelectric/electrostrictive layer 13.

The holding temperature T2 in the cooling step is set at about $900°$ C., higher than $0.5T_m(Pt)=1,021$ K ($748°$ C.), which is 0.5 times as high as the melting point $T_m(Pt)$ of platinum constituting the intermediate electrode layer 12.

EXAMPLES

Examples for confirming the effect of the above-described embodiment will now be described. The Examples evaluated the piezoelectric/electrostrictive characteristics of a piezoelectric/electrostrictive device 10'' shown in FIG. 4, prepared by a process in which the conditions of the cooling step and applied voltage (hereinafter referred to as polarization voltage) for polarization of the piezoelectric/electrostrictive layer 13 were varied.

The piezoelectric/electrostrictive device 10'' had the following structure. The piezoelectric/electrostrictive device 10'' included the intermediate electrode layer 12 and the piezoelectric/electrostrictive layer 13 on a vibration plate 11a corresponding to the substrate 11 shown in FIGS. 1 and 2A to 2D. In addition, an upper electrode 14 was formed on the piezoelectric/electrostrictive layer 13.

In the piezoelectric/electrostrictive device 10'', a polarization voltage was applied between intermediate electrode layer 12 and the upper electrode 14 to polarize the piezoelectric/electrostrictive layer 13 in the vertical direction in the figure. After the polarization, a predetermined driving voltage was applied between the intermediate electrode layer 12 and the upper electrode 14 to shrink the piezoelectric/electrostrictive layer 13 in the vertical direction in the figure, thereby bending the vibration plate 11a running between support portions 11b to deform it.

The vibration plate 11a was a 11 μm thick zirconia substrate. The intermediate electrode layer 12 was a 5 μm thick platinum electrode layer, and the BNT-KN piezoelectric/electrostrictive layer 13 was formed to a thickness of 20 μm.

The process of manufacturing the piezoelectric/electrostrictive device 10'' was performed in the same manner as the above-described specific method, except for the material of the piezoelectric/electrostrictive layer 13. The upper electrode 14 can be formed in the same manner as the intermediate electrode layer 12.

The polarization voltage was 140 V or 150 V, and the holding temperature T2 was $500°$ C. ($773.15$ K$=0.37T_m(Pt)$, Example 1) or $900°$ C. ($1173.15$ K$=0.57T_m(Pt)$, Example 2).

For a comparative example, a piezoelectric/electrostrictive device was use which had the same structure as the piezoelectric/electrostrictive device 10'' used in the examples, but prepared through the known cooling step without the temperature holding sub-step. Then piezoelectric/electrostrictive devices of the Examples and comparative example were evaluation by measuring the displacement at the center of the vibration plate 11a when a driving voltage of 30 V was applied between the intermediate electrode layer 12 and the upper electrode 14. The results are shown in the Table.

TABLE

| Polarization voltage | Comparative Example No temperature holding | Example 1 Holding temperature: $500°$ C. | Example 2 Holding temperature: $900°$ C. |
| --- | --- | --- | --- |
| 140 V | 0.05 μm | 0.08 μm | 0.12 μm |
| 150 V | 0.08 μm | 0.10 μm | 0.12 μm |

When a normal polarization voltage of 150 V was applied, the piezoelectric/electrostrictive characteristics were improved slightly in Example 1 and extremely in Example 2, in the comparison with the Comparative Example.

When a polarization voltage of 140 V, which was lower than that in the known process, was applied, Example 1 exhibited piezoelectric/electrostrictive characteristics improved much more than the comparative example, to the same extent as the device (known piezoelectric/electrostrictive device) produced under the normal polarization conditions in the comparative example. Example 2 exhibited more improved piezoelectric/electrostrictive characteristics than Example 1. Thus, the piezoelectric/electrostrictive devices produced according to the present invention exhibited much superior piezoelectric/electrostrictive characteristics to the known piezoelectric/electrostrictive device, even though a lower polarization voltage was applied.

MODIFICATIONS

While the present invention has been described using the above embodiment and examples, it will be readily appreciated by those skilled in the art that various modifications in form and detail may be made without departing from the scope and spirit of the invention. Some modification will be described below, but even the modifications do not limit the invention.

For example, a piezoelectric/electrostrictive material coating may be applied onto the intermediate electrode layer 12 before heat treatment, that is, onto an unfired electrode layer (for example, coating layer of a metal paste or the like), and then these layers may be heat-treated or fired together. Also, the cooling rate in the cooling step except the temperature holding sub-step is not limited to the above-described rate, at least the rate of natural cooling. The cooling step may be performed, for example, at the rate of natural cooling or less.

Figure 4:
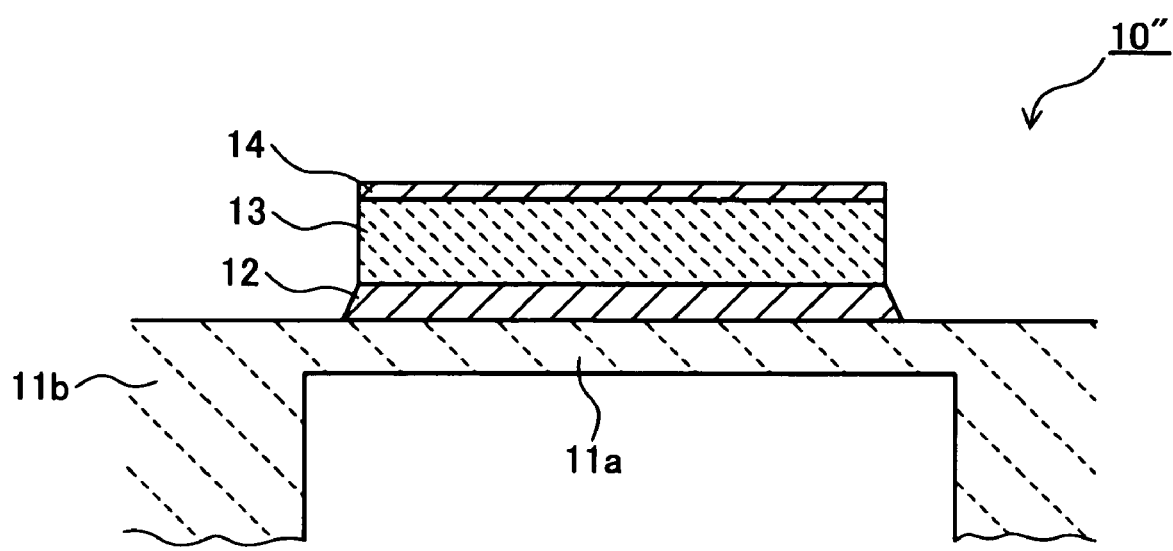
FIG. 4 is a schematic sectional side view of a piezoelectric/electrostrictive device used in examples.

The vibration plate 11a of the piezoelectric/electrostrictive device 10" shown in FIG. 4 may not be flat, and may be in a shape protruding upward like a so-called diaphragm.

The piezoelectric/electrostrictive layer 13 is not necessarily formed in a single-layer structure, and may have a multi-layer structure including a metal electrode layer disposed between a plurality of layers. In this instance, the layers of the piezoelectric/electrostrictive layer may be subjected to the cooling step including the temperature holding sub-step in their respective formations.

What is claimed is:

1. A method for manufacturing a piezoelectric/electrostrictive device including a $ZrO_2$ substrate, a Pt electrode layer adhering to a surface of the $ZrO_2$ substrate, and a piezoelectric/electrostrictive layer adhering to a surface of the Pt electrode layer, the method comprising the steps of:
    a first layer forming step of forming a first layer containing Pt on a $ZrO_2$ substrate so as to form a Pt electrode layer on a surface of the $ZrO_2$ substrate;
    a second layer forming step of forming a second layer containing a piezoelectric/electrostrictive material comprising a solid solution of bismuth sodium titanate and potassium niobate on the first layer;
    a firing step of heating the $ZrO_2$ substrate having the first layer and the second layer to a firing temperature to fire at least the second layer, thereby forming the piezoelectric/electrostrictive layer which has a thermal expansion coefficient that is greater than that of the $ZrO_2$ substrate and producing the piezoelectric/electrostrictive device; and
    a cooling step of cooling the piezoelectric/electrostrictive device after the firing step;
    wherein the cooling step comprises a sub-step of holding the piezoelectric/electrostrictive device at a constant temperature that is lower than the firing temperature during the cooling step; and
    wherein the constant temperature of the cooling sub-step is within a range of temperatures at which high-temperature creep occurs in the Pt electrode layer to provide a step of deforming the Pt electrode layer by high-temperature creep during the cooling sub-step.

2. The method according to claim 1, wherein the cooling step cools the piezoelectric/electrostrictive device at a temperature decreasing rate of at least a rate of natural cooling.

3. The method according to claim 1, wherein the constant temperature of the cooling sub-step is at least 0.3 times as high as a melting point in kelvin of the Pt.

4. The method according to claim 1, wherein said cooling step is performed directly after said firing step.

* * * * *